(12) United States Patent
Liu

(10) Patent No.: US 12,328,885 B2
(45) Date of Patent: Jun. 10, 2025

(54) METHOD FOR PROCESSING CAPACITIVE STRUCTURE AND SEMICONDUCTOR STRUCTURE

(71) Applicant: CHANGXIN MEMORY TECHNOLOGIES, INC., Hefei (CN)

(72) Inventor: Ang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 721 days.

(21) Appl. No.: 17/512,884

(22) Filed: Oct. 28, 2021

(65) Prior Publication Data

US 2022/0238638 A1 Jul. 28, 2022

Related U.S. Application Data

(63) Continuation of application No. PCT/CN2021/109334, filed on Jul. 29, 2021.

(30) Foreign Application Priority Data

Jan. 28, 2021 (CN) .......................... 202110116557.1

(51) Int. Cl.
*H10D 1/00* (2025.01)
*H01G 4/008* (2006.01)
(Continued)

(52) U.S. Cl.
CPC ............. *H10D 1/696* (2025.01); *H01G 4/008* (2013.01); *H01G 4/1272* (2013.01)

(58) Field of Classification Search
None
See application file for complete search history.

(56) References Cited

U.S. PATENT DOCUMENTS

2001/0046737 A1* 11/2001 Ahn ................... H10B 12/0335
257/E21.507
2005/0116274 A1* 6/2005 Hong ................... H10B 12/033
257/300

(Continued)

FOREIGN PATENT DOCUMENTS

CN 101699622 A 4/2010
CN 106298981 A 1/2017
(Continued)

OTHER PUBLICATIONS

International Search Report in the international application No. PCT/CN2021/109334, mailed on Nov. 4, 2021, 2 pgs.
(Continued)

*Primary Examiner* — Bilkis Jahan
(74) *Attorney, Agent, or Firm* — Kilpatrick Townsend & Stockton LLP

(57) ABSTRACT

The disclosure provides a method for processing a capacitive structure, and a semiconductor structure. The method for processing the capacitive structure includes the following steps: providing a substrate, forming a landing pad on a surface of the substrate, and etching the landing pad; forming a barrier layer on the surface of the substrate, the barrier layer covering the landing pad; etching the barrier layer to expose a part of the landing pad; forming a first dielectric layer on the surface of the substrate, the first dielectric layer covering the landing pad and the barrier layer; and etching the first dielectric layer and forming a capacitive contact plug.

14 Claims, 16 Drawing Sheets

(51) Int. Cl.
    *H01G 4/12*     (2006.01)
    *H10D 1/68*     (2025.01)

(56) References Cited

U.S. PATENT DOCUMENTS

2018/0166320 A1*   6/2018   Kim ..................... H10D 1/716
2019/0198506 A1*   6/2019   Kim ..................... H10B 12/485

FOREIGN PATENT DOCUMENTS

| | | |
|---|---|---|
| CN | 107393909 A | 11/2017 |
| CN | 107706181 A | 2/2018 |
| CN | 108231775 A | 6/2018 |
| CN | 108336068 A | 7/2018 |
| CN | 108962824 A | 12/2018 |
| CN | 109659222 A | 4/2019 |
| CN | 111106095 A | 5/2020 |
| CN | 111244065 A | 6/2020 |
| CN | 111755381 A | 10/2020 |
| CN | 112928030 A | 6/2021 |
| KR | 20010046663 A | 6/2001 |

OTHER PUBLICATIONS

Second Office Action of the Chinese application No. 202110116557.1, issued on Aug. 3, 2022, 20 pgs.
First Office Action of the Chinese application No. 202110116557.1, issued on Feb. 7, 2022, 18 pgs.

* cited by examiner

METHOD FOR PROCESSING CAPACITIVE STRUCTURE AND SEMICONDUCTOR STRUCTURE

CROSS-REFERENCE TO RELATED APPLICATIONS

This is a continuation of International Application No. PCT/CN2021/109334, filed on Jul. 29, 2021 and entitled "Method for Processing Capacitive Structure and Semiconductor Structure", which claims priority to Chinese patent application No. 202110116557.1, filed on Jan. 28, 2021 and entitled "Method for Processing Capacitive Structure and Semiconductor Structure". The disclosures of International Application No. PCT/CN2021/109334 and Chinese patent application No. 202110116557.1 are hereby incorporated by reference in their entireties.

TECHNICAL FIELD

The disclosure relates to the technical field of semiconductor manufacturing processes, and particularly to a method for processing a capacitive structure, and a semiconductor structure.

BACKGROUND

A position where a capacitive structure of the existing semiconductor structure is in contact with a landing pad is easy to be over etched, thereby forming a hole. Due to the poor adhesion of the material with higher dielectric constant (High K) compared with the electrode material (such as TiN) of the capacitive structure, if the hole is formed, the high-K material may not completely fit the upper electrode and the lower electrode of the capacitive structure. As a result, the upper electrode and lower electrode are in contact, and there is a risk of a short circuit between the upper electrode and lower electrode of the capacitive structure.

SUMMARY

An aspect of embodiments of the disclosure provides a method for processing a capacitive structure. The method for processing the capacitive structure includes the following steps: providing a substrate, forming a landing pad on a surface of the substrate, and etching the landing pad; forming a barrier layer on the surface of the substrate, the barrier layer covering the landing pad; etching the barrier layer to expose a part of the landing pad; forming a first dielectric layer on the surface of the substrate, the first dielectric layer covering the landing pad and the barrier layer; and etching the first dielectric layer and forming a capacitive contact plug.

Another aspect of the embodiments of the disclosure provides a semiconductor structure, which includes a substrate and a capacitor. A landing pad is formed on a surface of the substrate of the landing pad, and the capacitor is arranged on the substrate. A barrier layer is arranged on a surface of the landing pad, the barrier layer is configured to expose a part of the landing pad, and the capacitor is in contact with a part of the landing pad exposed to the barrier layer.

DETAILED DESCRIPTION

Figure 1:
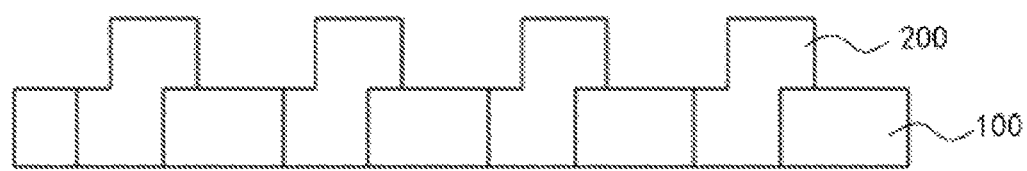
FIGS. 1 to 9 are respectively schematic structural diagrams of a semiconductor structure under several steps of a method for processing a capacitive structure shown according to an exemplary embodiment.

Exemplary embodiments are described more comprehensively with reference to the drawings. However, the exemplary embodiments may be implemented in various forms, and should not be understood as limitation to embodiments described in the disclosure. On the contrary, these provided embodiments enable the disclosure to be more comprehensive and complete, and conceptions of the exemplary embodiments are comprehensively conveyed to those skilled in the art. The same signs in the drawings may show same or similar structures, so that detailed description of them will be omitted.

FIGS. 1 to 9 respectively and representatively show schematic structural diagrams of a semiconductor structure under several steps of a method for processing a capacitive structure provided in the disclosure. In an exemplary embodiment, the method for processing the capacitive structure processing in the disclosure is described by taking a preparation process of the capacitive structure applied to the semiconductor structure as an example. It is easy for those skilled in the art to understand that, in order to apply the relevant design of the disclosure to other types of semiconductor structures or other processes, various modifications, additions, substitutions, deletions or other changes are made to the following specific embodiments, and these changes may be still within the scope of the principle of the method for processing the capacitive structure provided in the disclosure.

As shown in FIGS. 1 to 9, in the embodiment, the method for processing the capacitive structure provided in the disclosure at least includes the following steps.

A substrate 100 is provided, a landing pad 200 is formed on a surface of the substrate 100, and the landing pad 200 is etched.

A barrier layer 300 is formed on the surface of the substrate 100, where the barrier layer 300 covers the landing pad 200.

The barrier layer 300 is etched to expose a part of the landing pad 200.

A first dielectric layer 500 is formed on the surface of the substrate 100, where the first dielectric layer 500 covers the landing pad 200 and the barrier layer 300.

The first dielectric layer 500 is etched, and a capacitive contact plug is formed.

Through the above process design, the method for processing the capacitive structure provided in the disclosure may effectively improve the over etching problem between the capacitive contact plug and the landing pad 200 without changing the size of the capacitive contact plug, and also avoid the formation of a hole and the short circuit between a upper electrode and a lower electrode of a capacitor.

As shown in FIG. 1, FIG. 1 representatively shows a schematic structural diagram of the semiconductor structure in the step of providing a substrate 100, forming a landing pad 200 on a surface of the substrate 100, and etching the landing pad 200. Specifically, in the aforementioned step, the semiconductor structure may include the substrate 100 and the landing pad 200 retained after etching. The landing pad 200 may be formed on the surface of the substrate 100, and the landing pad 200 may expose a part of the surface of the substrate 100 after being etched.

Furthermore, in the embodiment, a material of the substrate 100 may include a nitride, such as, but not limited to, silicon nitride (SiN).

Furthermore, in the embodiment, a material of the landing pad 200 may include a metal, such as, but not limited to, tungsten (W).

Figure 2:
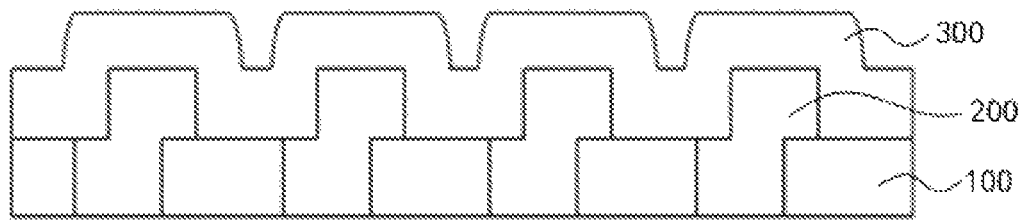
Figure 3:
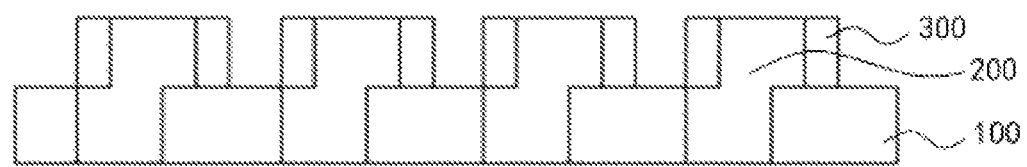

Alternatively, as shown in FIGS. 2 and 3, in the embodiment, the steps of "forming the barrier layer 300 on the surface of the substrate 100" and "etching the barrier layer 300" may include an operation of removing a part of the barrier layer 300 that covers a top surface of the landing pad 200 and removing a part of the barrier layer 300 that covers the surface of the substrate 100, to expose the top surface of the landing pad 200 and the part of the surface of the substrate that does not cover the landing pad 200. In other words, the barrier layer 300 may retain the part arranged on a side surface of the landing pad 200 after being etched. In other embodiments, the part of the barrier layer 300 that covers the surface of the substrate 100 may not be removed, which will not be limited to the embodiment.

As shown in FIG. 2, FIG. 2 representatively shows a schematic structural diagram of the semiconductor structure in the step of "forming the barrier layer 300 on the surface of the substrate 100". Specifically, in the aforementioned step, the semiconductor structure may include the substrate 100, the landing pad 200 and the barrier layer 300. The barrier layer 300 may be formed on the surface of the substrate 100, and the barrier layer 300 may cover the landing pad 200 and the surface of the substrate 100 where the landing pad 200 is not formed.

As shown in FIG. 3, FIG. 3 representatively shows a schematic structural diagram of the semiconductor structure in the step of "etching the barrier layer 300". Specifically, in the aforementioned step, the semiconductor structure may include the substrate 100, the landing pad 200 and a retained part of the barrier layer 300. The retained part of the barrier layer 300 after being etched, may be a part arranged on the side surface of the landing pad 200.

Furthermore, in the embodiment, a material of the barrier layer 300 may have a higher etching selection ratio relative to a material of the substrate 100. Accordingly, for the step of "etching the barrier layer 300", since the material of the barrier layer 300 has the higher etching selection ratio relative to the material of the substrate 100, the substrate 100 may be used as a stop layer in the etching process of the barrier layer 300. Therefore, the one-time partial removal can be realized when the barrier layer 300 is etched by controlling the morphology of the barrier layer 300 in response to the barrier layer 300 being formed. As such, the barrier layer 300 on the side surface of the landing pad 200 or other parts to be retained may be retained, to expose the required part of the landing pad 200.

Furthermore, based on the process design that the material of the barrier layer 300 has a higher etching selection ratio relative to the material of the substrate 100, in an embodiment, the material of the substrate 100 may include a nitride, and the material of the barrier layer 300 may include a polymeric ceramic material. For example, the material of the substrate 100 may include, but is not limited to, SiN, and the material of the barrier layer 300 may include, but is not limited to, SiNCH.

Figure 4:
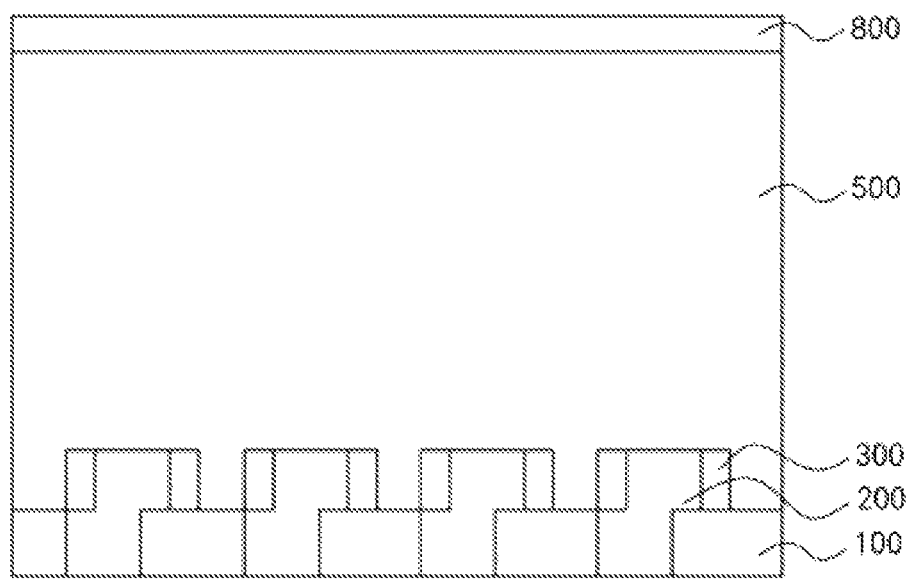

As shown in FIG. 4, FIG. 4 representatively shows a schematic structural diagram of the semiconductor structure in the step of "forming the first dielectric layer 500". Specifically, in the aforementioned step, the semiconductor structure may include the substrate 100, the landing pad 200, the barrier layer 300 and the first dielectric layer 500. The first dielectric layer 500 may be formed on the surface of the substrate 100, and the first dielectric layer 500 may cover the landing pad 200 and the retained barrier layer 300.

Furthermore, in the embodiment, the material of the first dielectric layer 500 may include an oxide, such as, but not limited to, silicon oxide ($SiO_2$).

Alternatively, as shown in FIGS. 5 to 9, in the embodiment, the step of "etching the first dielectric layer 500 and forming the capacitive contact plug" may specifically include the following steps.

The first dielectric layer 500 may be etched and a capacitance hole 600 may be formed, where the capacitance hole 600 may penetrate through the first dielectric layer 500, and the part of the landing pad 200 exposed to the barrier layer 300 may define a part of a hole wall of the capacitance hole 600.

A capacitor may be formed in the capacitance hole 600, and the capacitor may be in contact with the landing pad 200 to acquire the capacitive contact plug.

Figure 5:
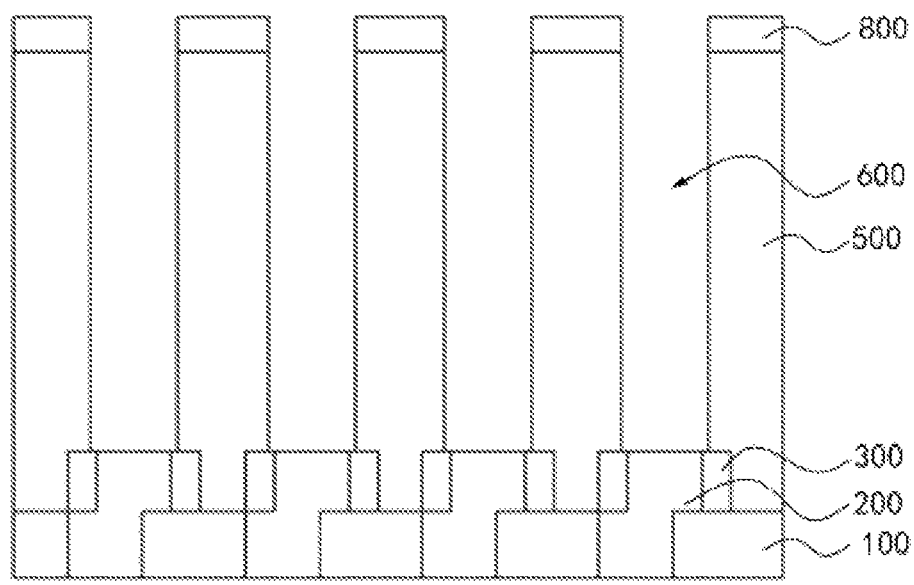
Figure 6:
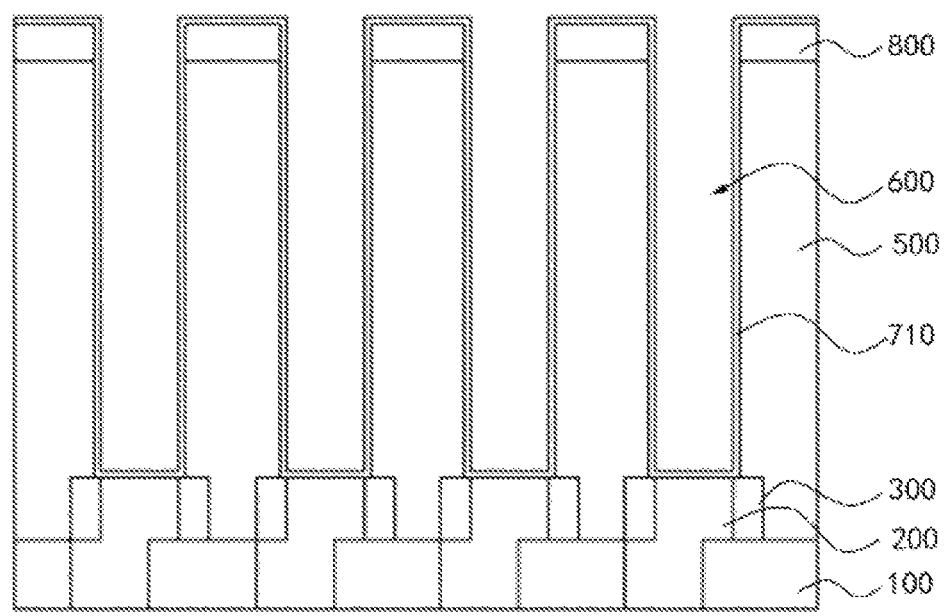
Figure 7:
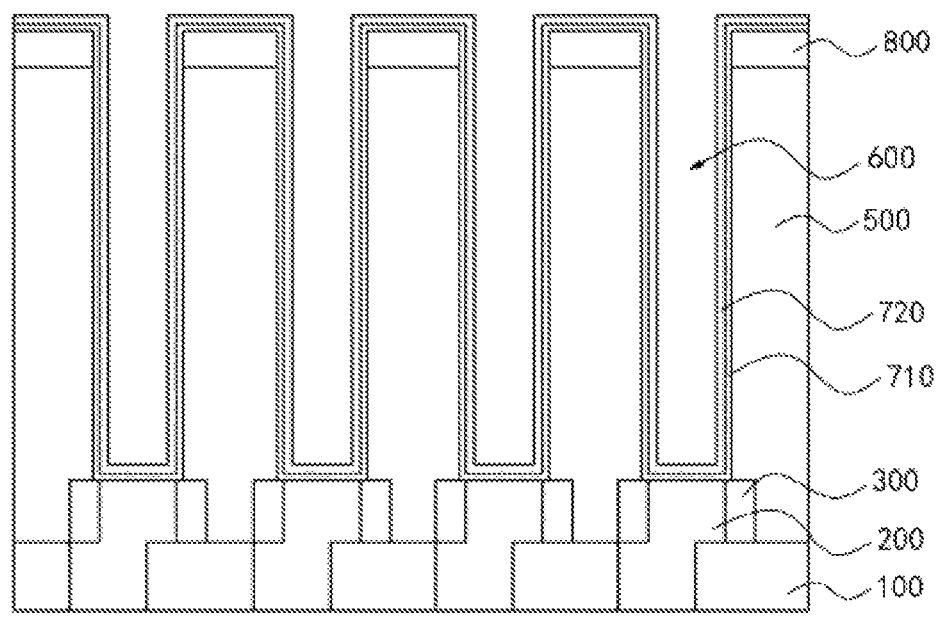
Figure 8:
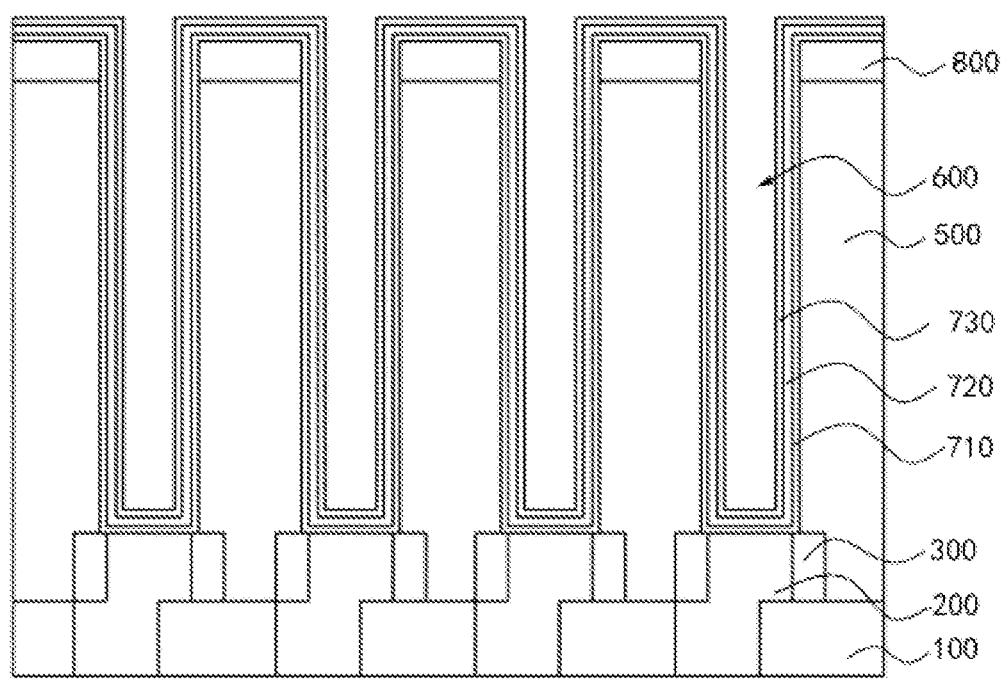

As shown in FIG. 5, FIG. 5 representatively shows a schematic structural diagram of the semiconductor structure in the step of "forming the capacitance hole 600". Specifically, in the aforementioned step, the semiconductor structure may include the substrate 100, the landing pad 200, the barrier layer 300, the first dielectric layer 500 and the capacitance hole. The capacitance hole 600 may be formed by partially removing the first dielectric layer 500 in the manner of etching, the capacitance hole 600 may be opened on the surface of the first dielectric layer 500, and the capacitance hole 600 may penetrate through the first dielectric layer 500 from top to bottom. The capacitance hole 600 may correspond to the position of the landing pad 200, and the capacitance hole 600 may be configured to form a capacitive structure, such as a capacitor. On this basis, a hole bottom contact surface of the capacitance hole 600 may be aligned with the landing pad 200, so that the above position of the capacitance hole 600 may not be easy to be over etched during the etching process. In other embodiments, by etching the barrier layer 300, when other parts (such as a part of the top surface of the landing pad 200 or the side surface of the landing pad) of the landing pad 200 are exposed, the exposed landing pad 200 may also participate in other parts (such as a part of the hole bottom or a part of the side wall) of the hole wall that defines the capacitance hole 600, which will not be limited to the embodiment.

Furthermore, as shown in FIGS. 6 to 9, in the embodiment, the step of "forming the capacitive contact plug" may specifically include the following steps.

A first electrode 710 may be formed on the hole wall (including the hole bottom and the side wall) of the capacitance hole 600.

A second dielectric layer 720 may be formed on the surface of the first electrode 710.

A second electrode 730 may be formed on the surface of the second dielectric layer 720.

Furthermore, in the embodiment, a material of the first electrode 710 may include a nitrogen-containing conductive material, such as, but not limited to, titanium nitride (TiN).

Furthermore, in the embodiment, a material of the second dielectric layer 720 may include a high-K material.

Furthermore, in the embodiment, the material of the second electrode 730 may include a nitrogen-containing conductive material, such as, but not limited to, titanium nitride (TiN). Moreover, the material of the second electrode 730 may be, but is not limited to, the same as that of the first electrode 710.

Alternatively, as shown in FIG. 4, in the embodiment, the method for processing the capacitive structure provided in the disclosure may further include the following steps.

After forming the first dielectric layer 500, a second support layer 800 may be formed on the surface of the first dielectric layer 500.

Specifically, as shown in FIG. 4, FIG. 4 representatively shows a schematic structural diagram of the semiconductor structure in the step of "forming the second support layer 800". Specifically, in the aforementioned step, the semiconductor structure may include the substrate 100, the landing pad 200, the barrier layer 300, the first dielectric layer 500 and the second support layer 800. The second support layer 800 may be formed on the surface of the first dielectric layer 500.

Moreover, as shown in FIGS. 5 to 9, based on the process design of "forming the second support layer 800", in the embodiment, the capacitance hole 600 may be formed by partially removing the second support layer 800 and the first dielectric layer 500 in the manner of etching. The capacitance hole 600 may be opened on the surface of the second support layer 800, and the capacitance hole 600 may penetrate through the second support layer 800 and the first dielectric layer 500 from top to bottom.

Furthermore, in the embodiment, the material of the second support layer 800 may include a nitride, such as, but not limited to, SiN.

Based on the above detailed description of an exemplary embodiment of the method for processing the capacitive structure provided in the disclosure, another exemplary embodiment of the method for processing the capacitive structure provided in the disclosure will be described below in combination with FIGS. 10 to 16.

As shown in FIGS. 10 to 16, in an embodiment, the method for processing the capacitive structure provided in the disclosure is roughly the same as the process design of the first embodiment mentioned above. The contents of the embodiment different from the first embodiment will be described in detail below.

Figure 10:
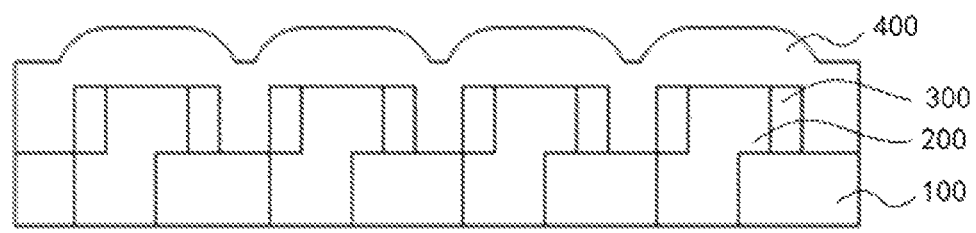
FIGS. 10 to 16 are respectively schematic structural diagrams of a semiconductor structure under several steps of a method for processing a capacitive structure shown according to another exemplary embodiment.

As shown in FIG. 10, in the embodiment, after the step of "etching the barrier layer 300 to expose the part of the landing pad 200", the following steps may be included.

A first support layer 400 may be formed on the surface of the substrate 100, the first support layer 400 may cover the landing pad 200 and the retained barrier layer 300.

On this basis, in the embodiment, the first dielectric layer 500 may cover the first support layer 400, and the capacitive contact plug may be formed by etching the first dielectric layer 500 and the first support layer 400.

As shown in FIG. 10, FIG. 10 representatively shows a schematic structural diagram of the semiconductor structure in the step of "forming the first support layer 400 on the surface of the substrate 100". Specifically, in the aforementioned step, the semiconductor structure may include the substrate 100, the landing pad 200, the barrier layer 300 and the first support layer 400. The first support layer 400 may be formed on the surface of the substrate 100, and the first support layer 400 may cover the landing pad 200, the retained barrier layer 300, and the part on the surface of the substrate 100 where the landing pad 200 and the barrier layer 300 are not formed.

Furthermore, in the embodiment, a material of the first support layer 400 may include a nitride, such as, but not limited to, SiN.

Figure 11:
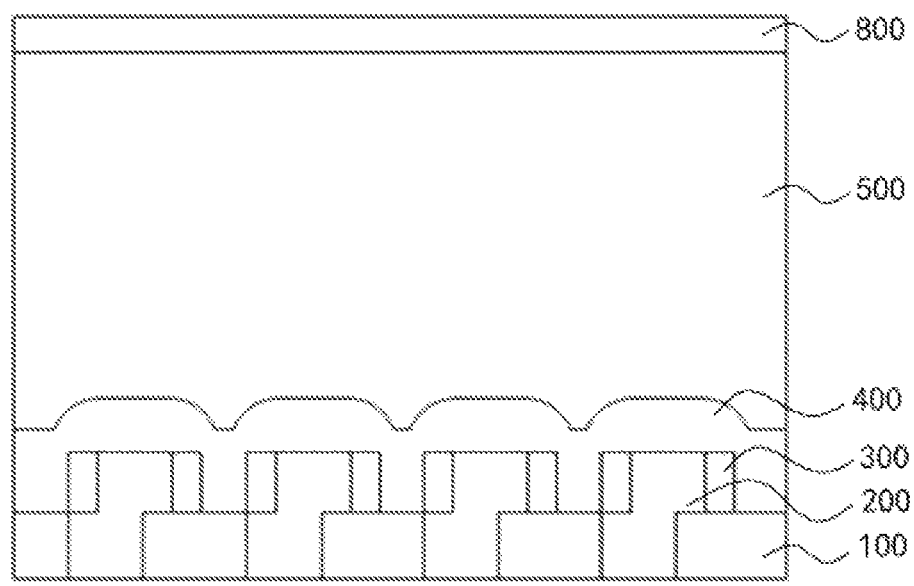

As shown in FIG. 11, FIG. 11 representatively shows a schematic structural diagram of the semiconductor structure in the step of "forming the first dielectric layer 500". Specifically, in the aforementioned step, the semiconductor structure may include the substrate 100, the landing pad 200, the barrier layer 300, the first support layer 400 and the first dielectric layer 500. The first dielectric layer 500 may be formed on the surface of the first support layer 400.

Figure 12:
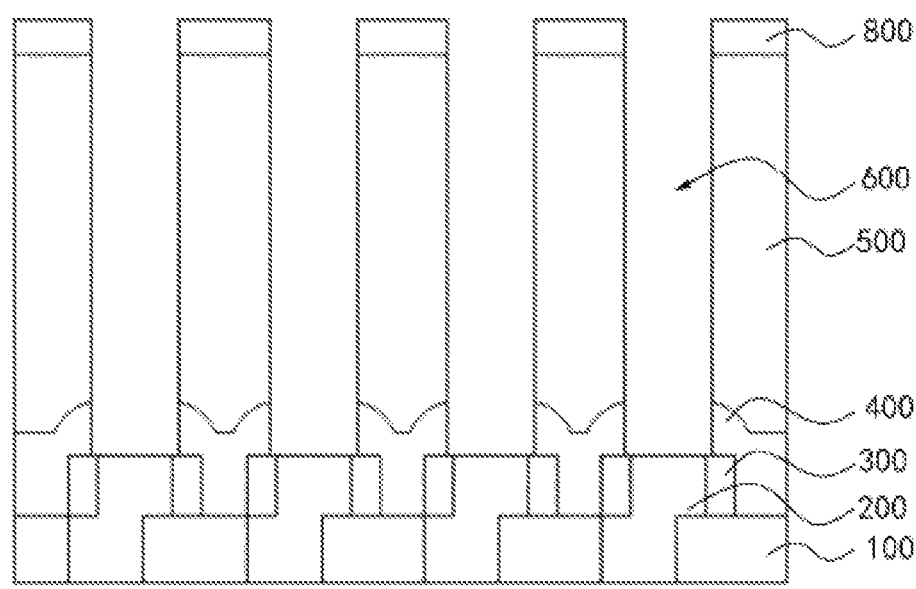
Figure 13:
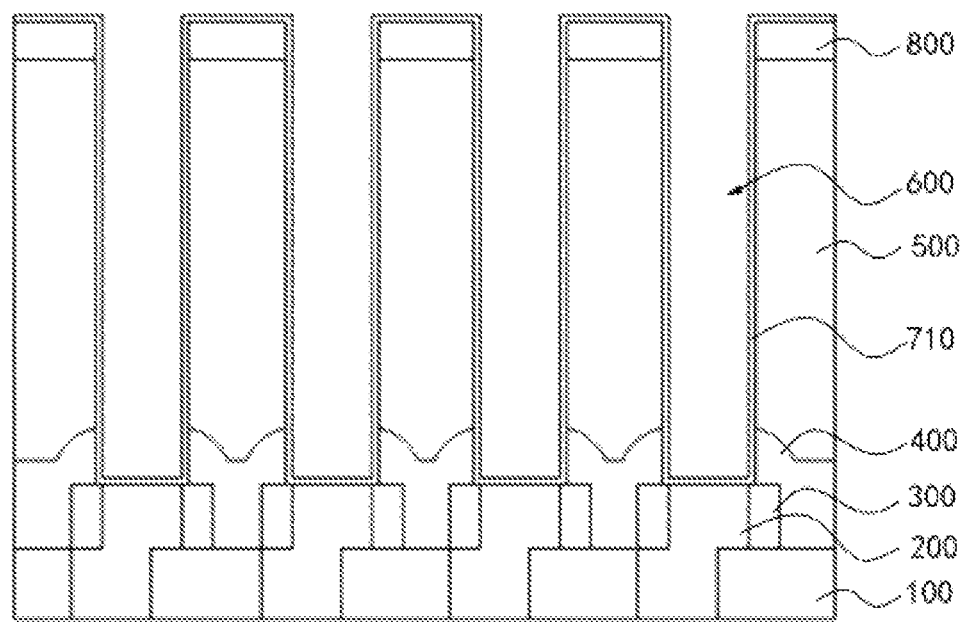
Figure 14:
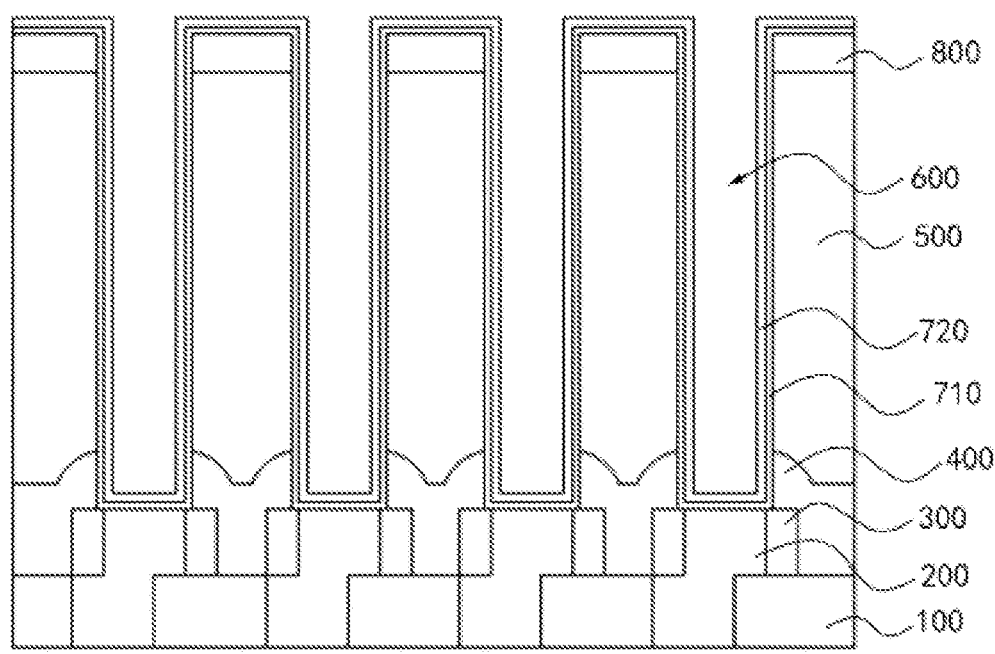
Figure 15:
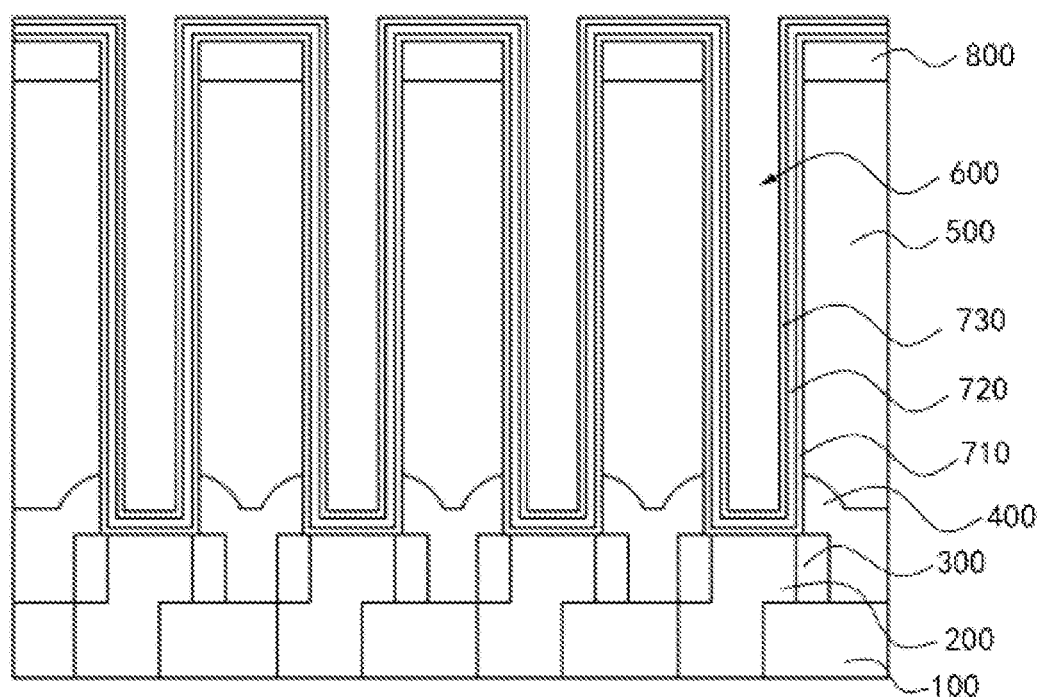

As shown in FIG. 12, FIG. 12 representatively shows a schematic structural diagram of the semiconductor structure in the step of "etching the first dielectric layer 500". Specifically, in the aforementioned step, the semiconductor structure may include the substrate 100, the landing pad 200, the barrier layer 300, the first support layer 400, the first dielectric layer 500 and the capacitance hole 600. The capacitance hole 600 may be formed by partially removing the first dielectric layer 500 and the first support layer 400 in the manner of etching. The capacitance hole 600 may be opened on the surface of the first dielectric layer 500. And the capacitance hole 600 may penetrate through the first dielectric layer 500 and the first support layer 400 from top to bottom.

As shown in FIGS. 13 to 16, FIGS. 13 to 16 representatively show schematic structural diagrams of the semiconductor structure in several steps of "forming the capacitive contact plug". In the aforementioned step, the method for forming the capacitive contact plug may roughly be the same as that of the first embodiment above, and will not be elaborated here. It should be noted that, since the embodiment may include the step of "forming the first support layer 400", that is, the capacitance hole 600 may be formed by penetrating through the first dielectric layer 500 and the first support layer 400. Therefore, in response to the capacitive contact plug being formed, the formation of the first electrode 710, the second dielectric layer 720 and the second electrode 730 may be implemented corresponding to the capacitance hole 600 penetrating through the first support layer 400 in the implementation mode. And it is different from the capacitance hole 600 only penetrating through the first dielectric layer 500 (which may also include the second support layer 800) described in the first embodiment, which is explained here.

Alternatively, as shown in FIGS. 11 to 16, in the embodiment, the method for processing the capacitive structure provided in the disclosure may also include the step of "forming the second support layer 800". In the aforementioned step, the method for forming the second support layer 800 may roughly be the same as that of the first embodiment above, and will not be elaborated here.

Moreover, as shown in FIGS. 12 to 16, based on the process design of "forming the second support layer 800", in the embodiment, the capacitance hole 600 may be formed by partially removing the second support layer 800, the first dielectric layer 500 and the first support layer 400 in the manner of etching. The capacitance hole 600 may be opened on the surface of the second support layer 800. And the capacitance hole 600 may penetrate through the second support layer 800, the first dielectric layer 500 and the first support layer 400 from top to bottom.

Furthermore, in the embodiment, when the two processing steps of "forming the first support layer 400" and "forming the second support layer 800" are included at the same time, the material of the first support layer 400 may be, but is not limited to, the same as the material of the second support layer 800.

It should be noted that, in various exemplary embodiments in accordance with the design concept of the disclosure, in addition to the first support layer 400 and the second support layer 800 in the aforementioned embodiment, it may also include the processing steps of forming other support layers, and a dielectric layer may be formed between two adjacent support layers. For example, the first dielectric layer 500 may be formed between the first support layer 400 and the second support layer 800, that is, after forming the first support layer 400 and before forming the second support layer 800, the first dielectric layer 500 may be formed on the first support layer 400. For example, in another embodiment, after forming the second support layer 800, a third dielectric layer may be continuously formed on the second support layer, and then a third support layer may be formed on other dielectric layers. On this basis, the capacitance hole 600 may be formed by partially removing the third support layer, the third dielectric layer, the second support layer 800, the first dielectric layer 500 and the first support layer 400 in the manner of etching. The capacitance hole 600 may be opened on the surface of the third support layer. And the capacitance hole 600 may penetrate through the third support layer, the third dielectric layer, the second support layer 800, the first dielectric layer 500 and the first support layer 400 from top to bottom. It should be noted here that, the method for processing the capacitive structure shown in the drawings and described in the specification may only be some examples of many processing methods that can adopt the principles of the disclosure. It should be clearly understood that, the principle of the disclosure may be by no means limited to any detail or any step of the method for processing the capacitive structure shown in the drawings or described in the specification.

In conclusion, according to the method for processing the capacitive structure provided in the disclosure, before the support layer and the first dielectric layer are formed, the barrier layer may be formed and the landing pad may be partly exposed. Therefore, the capacitive contact plug may not be easy to be over etched at a contact position of the capacitive contact plug contacting with the landing pad during the formation process of the capacitive contact plug, so as to avoid the hole generated at the contact position between the capacitive contact plug and the landing pad. Through the above process design, the method for processing the capacitive structure provided in the disclosure may effectively improve the over etching problem between the capacitive contact plug and the landing pad without changing the size of the capacitor, and also avoid the formation of the hole and the short circuit between the upper electrode and the lower electrode of the capacitor.

Figure 16:
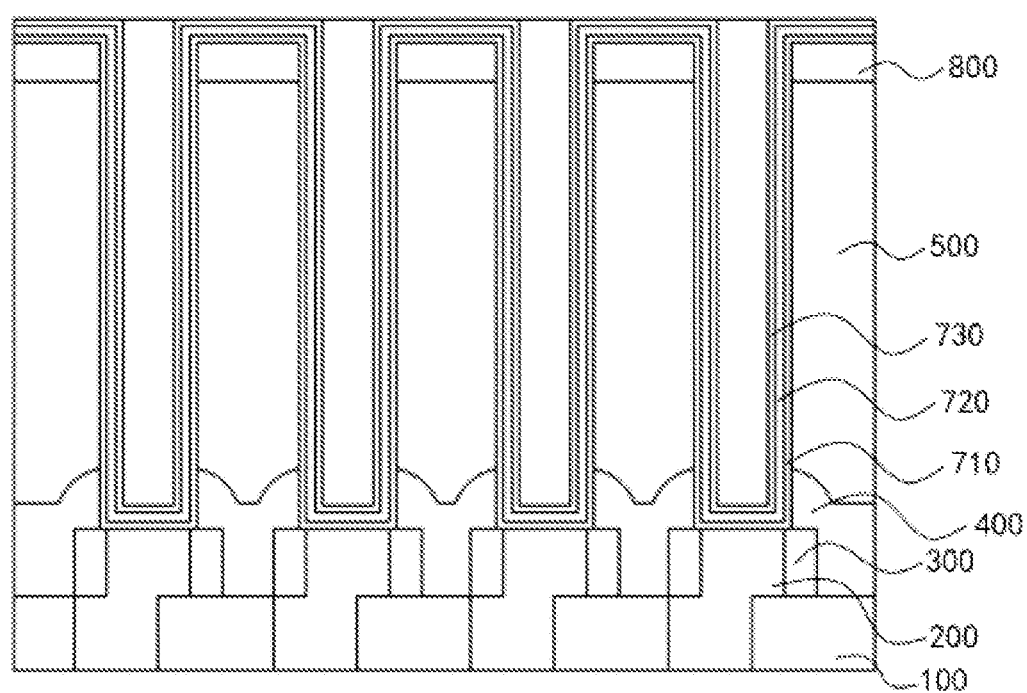

Based on the above detailed description of several exemplary embodiments of the method for processing the capacitive structure provided in the disclosure, an exemplary embodiment of the semiconductor structure provided in the disclosure will be described below in combination with FIG. 9 (or FIG. 16).

Figure 9:
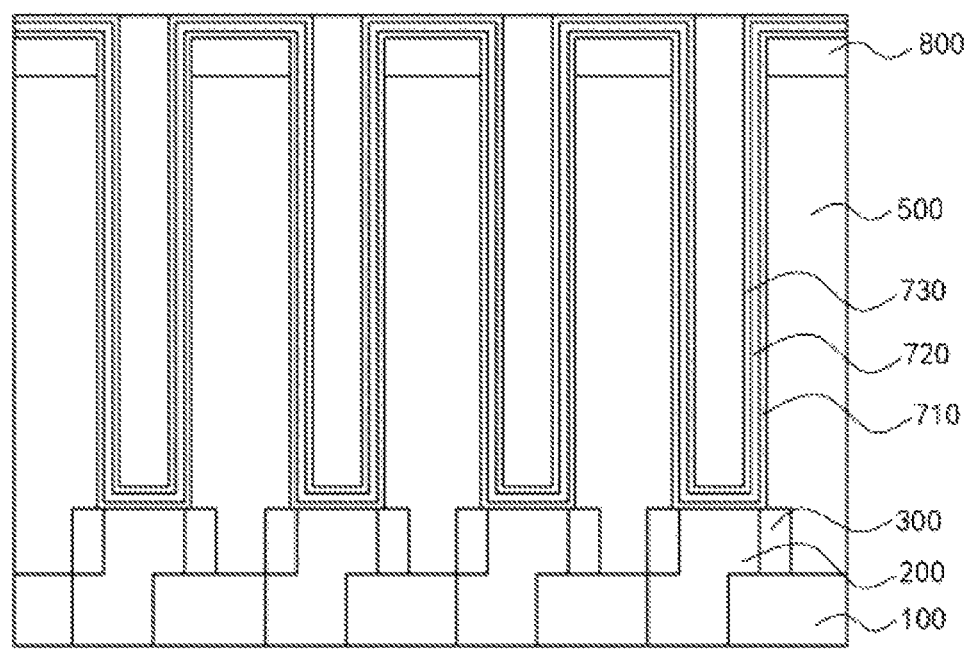

As shown in FIG. 9, in the embodiment, the semiconductor structure provided in the disclosure may include the substrate 100 and the capacitor. The landing pad 200 may be formed on the surface of the substrate 100, and the capacitor may be arranged on the substrate 100. The surface of the landing pad 200 may be provided with the barrier layer 300, the barrier layer 300 may expose a part of the landing pad 200, and the capacitor may be in contact with the part of the landing pad 200 exposed to the barrier layer 300, and then the capacitive contact plug may be formed. Through the above design, the semiconductor structure provided in the disclosure may effectively improve the over etching problem between the capacitive contact plug and the landing pad without changing the size of the capacitive contact plug, and also avoid the formation of the hole and the short circuit between the upper electrode and the lower electrode of the capacitor.

In conclusion, according to the semiconductor structure provided in the disclosure, the barrier layer may be formed and the landing pad may be partly exposed, so that the capacitive contact plug may not be easy to be over etched at a contact position of the capacitive contact plug contacting with the landing pad during the formation process of the capacitive contact plug, so as to avoid the hole generated at the contact position between the capacitive contact plug and the landing pad. Through the above process design, the semiconductor structure provided in the disclosure may effectively improve the over etching problem between the capacitive contact plug and the landing pad without changing the size of the capacitive contact plug, and also avoid the formation of the hole and the short circuit between the upper electrode and the lower electrode of the capacitor.

Although the disclosure has been described with reference to several exemplary embodiments, it should be understood that the terms used are illustrative and exemplary rather than limitative. Since the disclosure may be concretely implemented in various forms without departing from the spirit or essence of the disclosure, it should be understood that the aforementioned embodiments are not limited to any of the foregoing details, but should be widely interpreted within the spirit and scope defined by the appended claims. Therefore, all changes and modifications falling within the scope of the claims or their equivalents should be covered by the appended claims.

The invention claimed is:

1. A method for processing a capacitive structure, comprising:
   providing a substrate, forming a landing pad on a surface of the substrate, and etching the landing pad;
   forming a barrier layer on the surface of the substrate, the barrier layer covering the landing pad;
   etching the barrier layer to expose a part of the landing pad;
   forming a first dielectric layer on the surface of the substrate, the first dielectric layer covering the landing pad and the barrier layer; and
   etching the first dielectric layer and forming a capacitive contact plug.

2. The method for processing the capacitive structure of claim 1, wherein etching the barrier layer to expose a part of the landing pad comprises: removing the barrier layer that covers a top surface of the landing pad, to expose the top surface of the landing pad.

3. The method for processing the capacitive structure of claim 1, wherein
   a material of the barrier layer has a higher etching selection ratio relative to a material of the substrate.

4. The method for processing the capacitive structure of claim 3, wherein
   the material of the substrate comprises a nitride, and the material of the barrier layer comprises a polymeric ceramic material.

5. The method for processing the capacitive structure of claim 1, wherein
   a material of the first dielectric layer comprises an oxide.

6. The method for processing the capacitive structure of claim 1, wherein
   the etching the first dielectric layer and forming the capacitive contact plug comprises:

forming a capacitance hole, wherein the capacitance hole penetrate through the first dielectric layer, and the part of the landing pad exposed to the barrier layer defines a part of a hole wall of the capacitance hole; and forming a capacitor in the capacitance hole, wherein the capacitor is in contact with the landing pad to acquire the capacitive contact plug.

7. The method for processing the capacitive structure of claim 6, wherein the capacitor comprises a first electrode, a second dielectric layer and a second electrode.

8. The method for processing the capacitive structure of claim 7, wherein a material of the first electrode comprises a nitrogen-containing conductive material, and a material of the second electrode comprises a nitrogen-containing conductive material.

9. The method for processing the capacitive structure of claim 7, wherein a material of the second dielectric layer comprises a high-K material.

10. The method for processing the capacitive structure of claim 6, wherein the etching the barrier layer comprises: completely removing the part of the barrier layer that covers a top surface of the landing pad, to expose all of the top surface of the landing pad, wherein when the first dielectric layer being etched, a hole-bottom contact surface of the capacitance hole is aligned with the landing pad.

11. The method for processing the capacitive structure of claim 1, further comprising:

forming a first support layer on the surface of the substrate after etching the barrier layer, the first support layer covering the landing pad and the barrier layer;

wherein the first dielectric layer covers the first support layer, and etching the first dielectric layer and forming a capacitive contact plug further comprises: the first support layer.

12. The method for processing the capacitive structure of claim 11, wherein a material of the first support layer comprises a nitride.

13. The method for processing the capacitive structure of claim 1, further comprising:

forming a second support layer on the surface of the first dielectric layer after forming the first dielectric layer;

wherein the capacitive contact plug is formed by etching the second support layer and the first dielectric layer.

14. The method for processing the capacitive structure of claim 13, wherein a material of the second support layer comprises a nitride.

* * * * *